(12) United States Patent
Kobayashi et al.

(10) Patent No.: US 6,496,409 B2
(45) Date of Patent: Dec. 17, 2002

(54) VARIABLE CAPACITY SEMICONDUCTOR MEMORY DEVICE

(75) Inventors: Shinichi Kobayashi, Tokyo (JP); Yoshihide Kai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/620,719

(22) Filed: Jul. 20, 2000

(65) Prior Publication Data

US 2002/0057595 A1 May 16, 2002

(30) Foreign Application Priority Data

Jan. 19, 2000 (JP) ........................................ 2000-010442

(51) Int. Cl.[7] ............................................. G11C 16/04
(52) U.S. Cl. .............................. 365/185.03; 365/185.11; 365/185.23
(58) Field of Search ....................... 365/185.03, 185.11, 365/185.23, 230.06, 230.03

(56) References Cited

U.S. PATENT DOCUMENTS 5,959,882 A * 9/1999 Yoshida et al. ......... 365/185.03
6,052,315 A * 4/2000 Katayama et al. ...... 365/189.05
6,067,265 A * 5/2000 Mukunoki et al. .......... 365/210
6,122,193 A * 9/2000 Shibata et al. ......... 365/185.03
6,137,719 A * 10/2000 Tsuruda et al. ........ 365/185.03
6,246,614 B1 * 6/2001 Ooishi .................... 365/230.03
6,353,553 B1 * 3/2002 Tamada et al. ........ 365/185.03

FOREIGN PATENT DOCUMENTS

JP           6-309890          11/1994

OTHER PUBLICATIONS

U.S. application Ser. No. 09/615,309 filed Jul. 12, 2001.

* cited by examiner

*Primary Examiner*—David Nelms
*Assistant Examiner*—Gene N. Auduong
(74) *Attorney, Agent, or Firm*—McDermott, Will & Emery

(57) ABSTRACT

The invention provides a semiconductor memory capable of realizing an efficient use of a memory area and reducing manufacturing costs. A memory has a memory cell array comprising a matrix of cells for electrically storing data. The memory cell array is divided into a plurality of block areas. Each block area is set to a four-valued area for recording the data as four-valued data or a binary area for recording the data as binary data. On an access to a memory cell (writing or reading of the data), a word line voltage for writing or a sense amplifier for reading is switched in accordance with whether the data to be accessed is the binary data or the four-valued data.

16 Claims, 6 Drawing Sheets

VARIABLE CAPACITY SEMICONDUCTOR MEMORY DEVICE

BACKGROUND OF THE INVENTION

1. Field of the Invention

The present invention relates to an electrically erasable and programmable semiconductor memory device, more particularly, to a semiconductor memory device which implements a variable capacity by enabling the writing of binary or multivalued information.

2. Description of the Related Art

In general, electronic equipment is provided with memories for storing a program for controlling its operation, various data such as audio data and image data, or the like. Generally, a flash memory capable of high-speed random access is used to store the control program, and a flash memory with large capacity is used to store the data.

The electronic equipment must have therefore two types of flash memories, i.e., a low-speed but large-capacity memory and a high-speed but small-capacity random access memory, as shown in FIG. 7A. Moreover, in a designing stage, most of the flash memories for storing the control program must be designed so that capacity of the memory is enough large to store any potential program, since there exists possibility to change a size of the program to be stored. Consequently, the flash memory of large size is often designed. Thus, when the control program actually developed is small in size as shown in FIG. 7B, a problem of a useless area exists because the memory size cannot be changed later. This problem can be solved by using the flash memory for high-speed random access for both of the control program and the data, as shown in FIG. 7C. However, such a solution has a problem of an increase in manufacturing costs because the flash memory for high-speed random access is expensive.

SUMMARY OF THE INVENTION

The invention is directed to solve the foregoing problems, that is, to provide a semiconductor memory device capable of realizing an efficient use of a memory area and reducing the manufacturing costs.

In a first aspect of the invention, a nonvolatile semiconductor memory device capable of electrical data writing and data reading, comprises a memory cell array, a word line driver, a voltage controller and a binary/multivalued controller.

The memory cell array comprises a plurality of memory cells and has a data storing area or a memory space divided into a plurality of areas. Each of the areas selectively is set to a binary area for storing binary data or a multivalued area for storing multivalued data. The word line driver supplies a driving voltage to a word line of the memory cell array. The voltage controller controls an output voltage of the word line driver. The binary/multivalued controller controls the voltage controller so as to switch the output voltage of the word line driver in accordance with whether the data is to be recorded to the cell in the form of the binary data or the multivalued data.

The memory device may further comprise a unit for storing information which indicates whether the divided area of the memory cell array is the binary area or the multivalued area. Each divided area of the memory cell array can be set arbitrarily to either of the binary area or the multivalued area in a memory address space.

The memory device may further comprise a switching unit for switching a method of outputting data to an external device in accordance with whether the data is recorded in the form of binary data or multivalued data.

The memory device may further comprise a switching unit for switching a method of writing data in accordance with the data is to be recorded in the form of binary data or multivalued data.

The memory device may further comprise an output unit for outputting latency information corresponding to the address of the data to be read.

The memory device may further comprise a unit for changing a predetermined parameter related to synchronous burst reading in accordance with the address at a synchronous burst reading operation.

The memory device may further comprise a bit line selecting unit for selecting a plural predetermined number of bit lines on data reading. One data value may be read out from a predetermined number of memory cells connected to one word line and the predetermined number of bit lines selected by the bit line selecting unit.

In the memory device, the multivalued sense amplifier may read the multivalued data by using a delay during the reading operation of the data from the memory cell.

In a second aspect of the invention, a nonvolatile semiconductor memory device capable of electrically writing and reading data, comprises a memory cell array, a binary sense amplifier, a multivalued sense amplifier and a binary/multivalued controller.

The memory cell array comprises a plurality of memory cells and has a data storing area or a memory space divided into a plurality of areas. Each of the divided areas is set selectively to a binary area for storing binary data or a multivalued area for storing multivalued data. The binary sense amplifier is used when the binary data is read out from the memory cell. The multivalued sense amplifier is used when the multivalued data is read out from the memory cell. The binary/multivalued controller selects, as a sense amplifier to be used in data reading, the binary sense amplifier when the data is read from the binary area, or the multivalued sense amplifier when the data is read from the multivalued area.

According to the invention, one semiconductor memory can record the data as both of the binary data and the multivalued data (for example, four valued data), and the capacity can be freely changed. It is therefore possible to realize the semiconductor memory capable of improving the efficiency of the use of the memory area and reducing manufacturing costs.

It should be noted that this application is based on application No. 2000-10442 filed in Japan, the contents of which is incorporated herein by reference.

DETAILED DESCRIPTION OF THE PREFERRED EMBODIMENTS

An embodiment of a semiconductor memory according to the invention will be described in detail below with reference to the accompanying drawings.

In a flash memory of this embodiment, an area for recording binary data and an area for recording four-valued data are set arbitrarily in a memory area formed by a matrix of memory cells which store data. Thus, one memory can be divided into a plurality of divided areas for use in accordance with applications, and thereby a variable capacity is realized to improve the efficiency in use of the memory. Specifically, the memory area is divided into a predetermined number of blocks, and each block is selectively set to the area for recording the binary data or the area for recording the four-valued data.

(Structure of Flash Memory)

Figure 1:
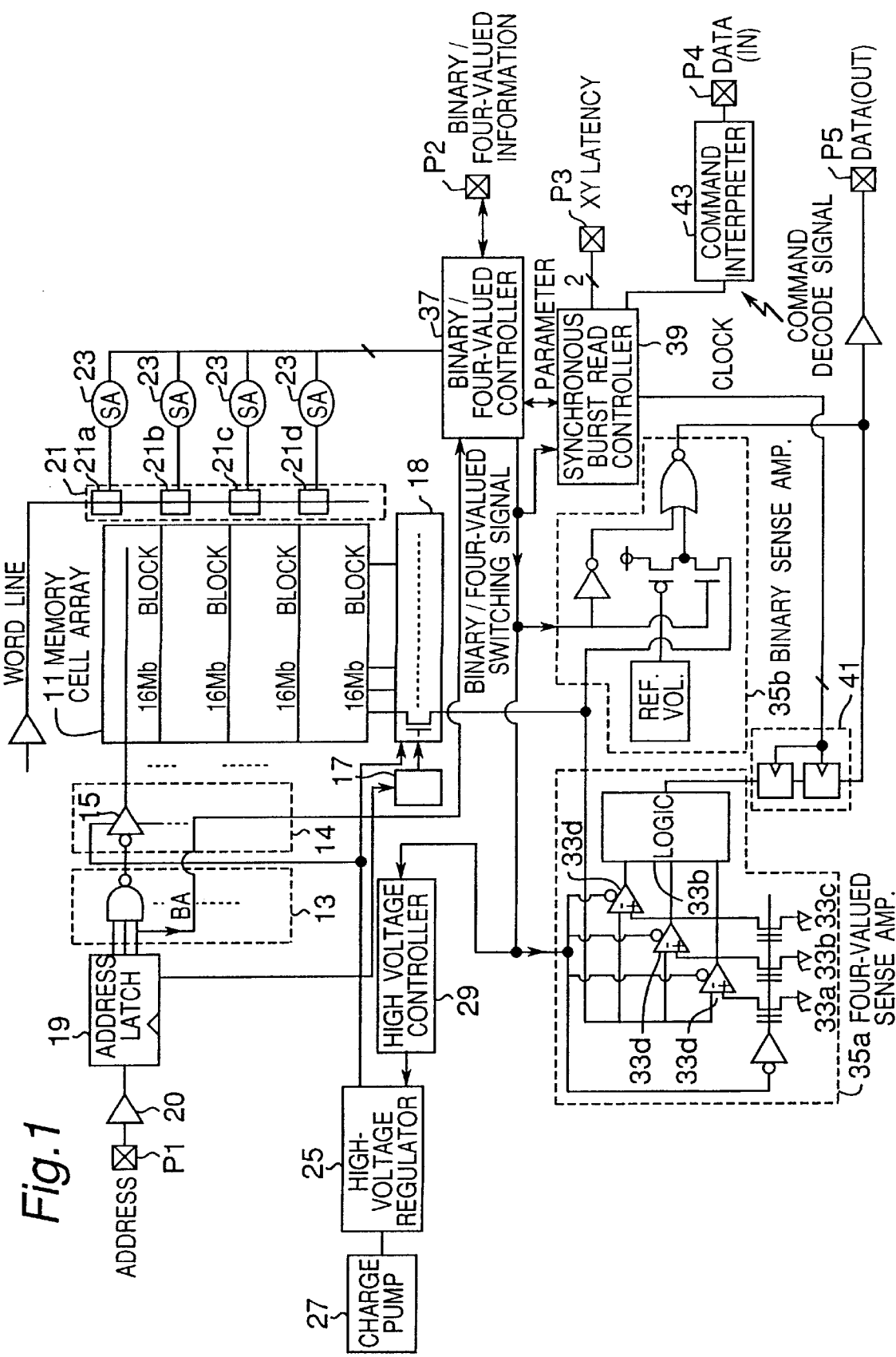
FIG. 1 shows a structure of a flash memory according to the invention.

FIG. 1 shows a structure of the flash memory according to the invention. The flash memory comprises a memory cell array 11 having a matrix of memory cells for storing data, a predecoder 13 for predecoding an address of the data to be accessed for selection of a word line, a row decoder 14 for selecting the word line of the memory cell array 11, a predecoder 17 for predecoding the address for selection of a bit line, a column decoder 18 for decoding the address to select the bit line of the memory cell array 11, a high-voltage regulator 25 for applying a driving voltage to the word line of the memory cell array, sense amplifiers 35a and 35b for amplifying the voltage read from a specified cell of the memory cell array 11, a binary/four-valued controller 37 for switching control in accordance with whether the data to be read is stored as the binary data or the four-valued data, a synchronous burst read controller 39 for controlling a synchronous burst reading, and a data latch 41 for latching the data for the synchronous burst reading.

The flash memory further has several pins P1 to P4 through which data or signal is input or output. An address input pin P1 inputs the address of the data to be accessed. A binary/four-valued information input/output pin P2 inputs or outputs information indicating whether the data is the binary data or the four-valued data. A latency information output pin P3 outputs latency information. A data input pin P4 inputs the data or a command. A data output pin P5 outputs the read data.

The memory cell array 11 shown in FIG. 1 has a capacity of 64 Mb as a whole. The memory cell array 11 is divided into four blocks, each of which has a capacity of 16 Mb. In the flash memory of this embodiment, each block can be set to an area for recording the binary data (referred to as "a binary area") or an area for recording the four-valued data (referred to as "a four-valued area").

Figure 2A:
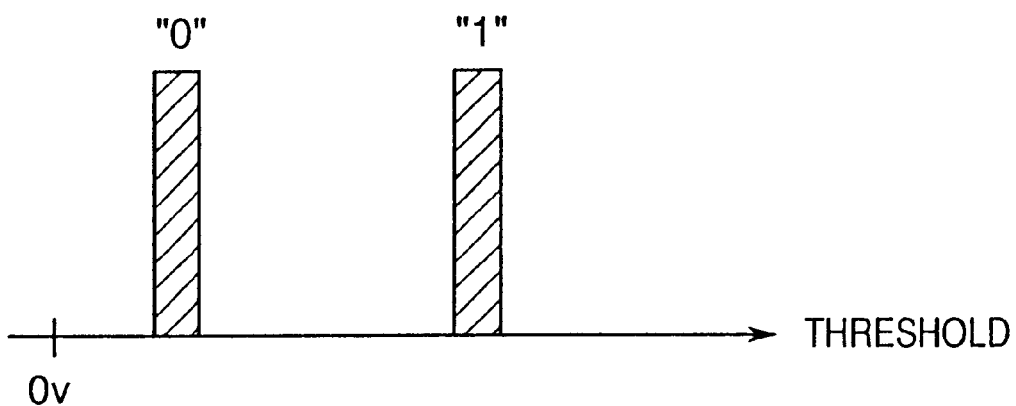
FIG. 2A shows a distribution of threshold value of a binary memory.
Figure 2B:
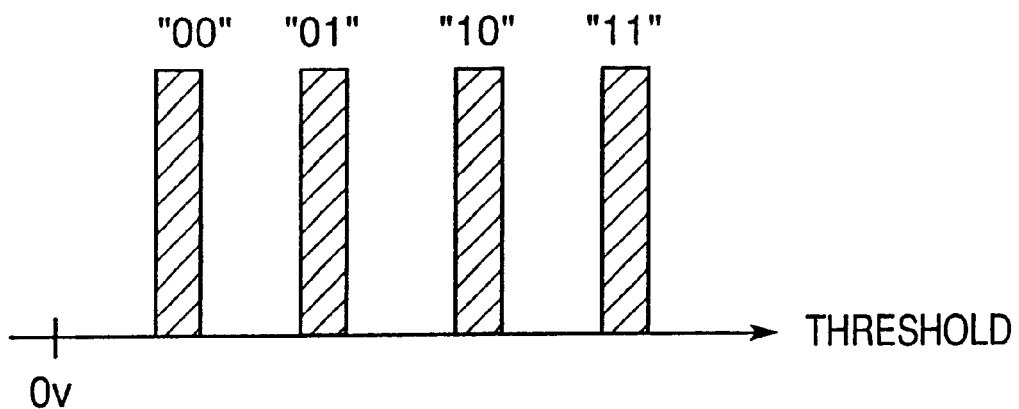
FIG. 2 shows a distribution of threshold value of a four-valued memory.

The respective statuses of the cells for the binary data and the four-valued data will be now described. FIGS. 2A and 2B show a distribution of threshold value of the cell (a binary memory) for recording the binary data and a distribution of threshold value of the cell (a four-valued memory) for recording the four-valued data, respectively. The distribution of threshold value of the cell is thus changed, whereby the binary or four-valued data can be recorded.

The sense amplifier 35a becomes active when the data is read from the four-valued memory block. The sense amplifier 35b becomes active when the data is read from the binary memory block. For convenience of description, only one each of the sense amplifiers 35a and 35b is shown in FIG. 1. However, a plurality of sense amplifiers 35a and 35b are actually provided in accordance with the number of output bits of the memory. The sense amplifier 35b for the binary data reads out the data in accordance with a cell current value. The sense amplifier 35a for the four-valued data comprises three reference cells 33a to 33c, three comparators 33d and a logic circuit 33e. The reference cells 33a to 33c have different threshold values respectively. Specifically, the reference cells 33a to 33c have the threshold values corresponding to the voltage between first and second threshold values shown in FIG. 2B, the voltage between the second and third threshold values and the voltage between the third and fourth threshold values, respectively. The logic circuit 33e determines a difference between current of the read cell and current of the each reference cells 33a, 33b or 33c, to decide the four-valued data. Then, the logic circuit 33e outputs the decided result.

When the high-voltage regulator 25 receives a power supply voltage from a charge pump 27, the high-voltage regulator 25 switches or varies a word line voltage, which is the voltage to be applied to the word line, in order to drive the word line in accordance with whether an access is made to the binary memory block or to the four-valued memory block. That is, under the control of a high-voltage controller 29, the high-voltage regulator 25 controls a word line driver 15 in accordance with the kind of a memory block to be accessed, thereby changing the word line voltage.

Moreover, the flash memory of this embodiment has a binary/four-valued discrimination memory 21 consisting of cells 21a to 21d for storing the information indicating whether each block of the memory cell array 11 is used as the binary memory block or the four-valued memory block. The data from the binary/four-valued discrimination memory 21 is passed to the binary/four-valued controller 37 through a sense amplifier 23.

As described above, in the flash memory of this embodiment, each block can be set arbitrarily to the binary area or the four-valued area. Therefore, for example, one of four blocks can be set to the binary area (this block is referred to as "binary memory block"), and the remaining three can be set to the four-valued area (this block is referred to as "four-valued memory block"). In this case, since three blocks are used as the four-valued memory block, each of those blocks can have a double capacity (16×2=Mb). In short, when the memory for storing a control program comprises the binary memory block and the memory for storing the data comprises the four-valued memory block, a combination of memories is changed, whereby the capacities of the memories can be freely changed in the following manner.

TABLE 1

| Memory capacity for storing program | Memory capacity for storing data |
|---|---|
| 16 Mb (=16 Mb × 1) | 96 Mb (=32 Mb × 3) |
| 32 Mb (=16 Mb × 2) | 64 Mb (=32 Mb × 2) |
| 48 Mb (=16 Mb × 3) | 32 Mb (=32 Mb × 1) |

One memory cell array 11 is divided into a plurality of areas to be used in the above-described manner, whereby one type of memory can perform functions of two types of memories. Thus, the capacity of the whole memory can be freely changed, and therefore the memory area can be efficiently used. An operation of the flash memory of this embodiment will be described below.

(Setting of Binary Area or Four-valued Area)

Setting of the binary area or the four-valued area in the memory cell array 11 of the flash memory will be described. This is carried out in the following manner. When the address is inputted through the address pin P1 and a signal indicating whether the data is the binary data or the four-valued data (the signal is referred to as "binary/four-valued information") is inputted through the information input pin P2, the binary/four-valued controller 37 writes information indicating whether the addressed block is the binary memory block or the four-valued memory block onto the cells 21a to 21d of the binary/four-valued discrimination memory 21 in accordance with the binary/four-valued information. With reference to the information written on the binary/four-valued discrimination memory 21, it can be determined whether the data in the read block is recorded as the binary data or the four-valued data at reading operation of the data.

The reading operation of the data from the binary/four-valued discrimination memory 21 is performed in the following way. That is, a block selection signal BA which is obtained by predecoding the address by the predecoder 13, is input to the binary/four-valued controller 37. Then, the memory 21 corresponding to the selected memory block is read, and the information read from the memory 21 is output to an external through the pin P2. Thus, an external controller such as MCU (memory control unit) can obtain the binary or four-valued information.

(Operation of Flash Memory During Data Writing)

At the writing of the data, it is necessary to change voltage to be applied to the word line in accordance with whether the data is written in the form of the binary data or the four-valued data. Because conditions of the voltage to be applied to the word line of the memory cell differ in accordance with whether the data is written as the binary data or the four-valued data.

In the flash memory, when the address and the data are inputted from the external circuit through the address pin P1 and the data input pin P4, respectively, the binary/four-valued controller 37 determines whether the data write area is the binary area or the four-valued area in accordance with the input address and the data in the binary/four-valued discrimination memory 21. Then, the controller 37 sends a signal specifying the binary area or the four-valued area (this signal is referred to as "binary/four-valued switch signa") to the high-voltage controller 29 in accordance with the result of the determination. The high-voltage controller 29 switches an output voltage of the high-voltage regulator 25 in accordance with whether the binary area or the four-valued area is specified by the binary/four-valued switch signal, thereby switching or varying the voltage supplied to the word line driver 15. At this time, the binary/four-valued controller 37 controls the high-voltage controller 29 so that a predetermined write voltage is also applied to the bit line. In the data writing operation, it is also verified whether or not the data is correctly written is performed.

In the data writing operation, the binary/four-valued controller 37 may receive the binary/four-valued information from the external circuit through the pin P2, as well as the address and the data, and send the binary/four-valued switch signal to the high-voltage controller 29 in accordance with the received signal.

(Operation in Data Reading)

In data reading operation, a method of reading the binary data differs from the method of reading the four-valued data.

Thus the flash memory switches between the sense amplifiers 35a and 35b to be used in accordance with the binary/four-valued switch signal from the binary/four-valued controller 37. That is, the binary/four-valued controller 37 reads the data in the binary/four-valued discrimination memory 21 in accordance with the block selection signal BA provided by predecoding the input address. The binary/four-valued controller 37 determines whether the read area is the binary area or the four-valued area to outputs the binary/four-valued switch signal in accordance with the determination result. This signal selectively activates the sense amplifier 35a for the four-valued data or the sense amplifier 35b for the binary data.

During the reading of the data, the binary/four-valued controller 37 may receive the binary/four-valued information from the external circuit through the pin P2, as well as the address. The binary/four-valued controller 37 may switch or select the sense amplifier to be used in accordance with the received signal.

(Switching of Outputting Method)

The flash memory can internally switch or selects the method of outputting the data during the reading between asynchronous random reading and synchronous burst reading in accordance with whether the data to be read is the binary data or the four-valued data. For example, the flash memory can switch the outputting method so that the asynchronous random reading may be performed for the reading of the binary data, and high-speed reading can be performed by the synchronous burst reading for the reading of the four-valued data because random access has low speed.

That is, during the read operation, when receiving the binary/four-valued switch signal indicative of four-valued data from the binary/four-valued controller 37, the synchronous burst read controller 39 sends a clock signal for the synchronous burst reading to the data latch 41 for the burst reading. Thus, the data latch 41 is switched to perform the control operation for the burst reading, and the data read from the memory cell array 11 is burst read through the sense amplifier 35a for the four-valued data and the data latch 41. At this time, the sense amplifier 35a is selected (activated) in accordance with the binary/four-valued switch signal. On the other hand, when the received binary/four-valued switch signal indicates the binary data, the synchronous burst read controller 39 outputs a control signal to inactivate the data latch 41 for the burst reading. Moreover, the sense amplifier 35b is activated, and the random reading is performed through the sense amplifier 35b.

(Output of XY Latency Information)

In the case of the synchronous burst reading, when receiving a request for XY latency information from the external circuit, the flash memory of this embodiment has the function of outputting XY latency information through the output pin P3.

That is, when a command for requesting the latency information is inputted from the external circuit through the pin P4, a command interpreter 43 interprets the command to output the interpreted command to the synchronous burst read controller 39. On receiving the command, the controller 39 outputs the latency information (or parameter) through the pin P3. Thus, a controller such as an external memory controller receiving burst data from the flash memory can recognize the latency information (or parameter).

That is, the controller 39 refers to a preset table based on the value of the block selection signal BA and the value of the memory cell 21a for binary/four-valued discrimination to determine and output the parameter for the synchronous burst reading for each memory block. Thus, the controller 39 can arbitrarily change the parameter for the synchronous burst reading for each memory block.

The flash memory may output not only the latency information but also predetermined parameters.

In other words, the binary/four-valued controller 37 may have stored a predetermined parameter for each block in an internal latch. In the reading operation, the controller 37 may outputs the parameter corresponding to the predecoded block selection signal BA.

The parameter is set in the following manner. In the circuit shown in FIG. 1, the address for specifying the block and the command to set the parameter for the synchronous burst reading are inputted through the address pin P1 and the pin P4, respectively. The binary/four-valued controller 37 receives the block selection signal BA from the predecoder 13, and furthermore inputs the decoded command and the set parameter through the synchronous burst read controller 39 to store the predetermined parameter for each block to the internal latch.

During the reading operation, the binary/four-valued controller 37 determines the parameter corresponding to the predecoded block selection signal BA among the parameters stored in the internal latch to send the determined parameter to the synchronous burst read controller 39. Thus, the synchronous burst read controller 39 can control a clock for the data latch 41 in accordance with the parameter.

(High-speed Reading Operation)

Figure 3:
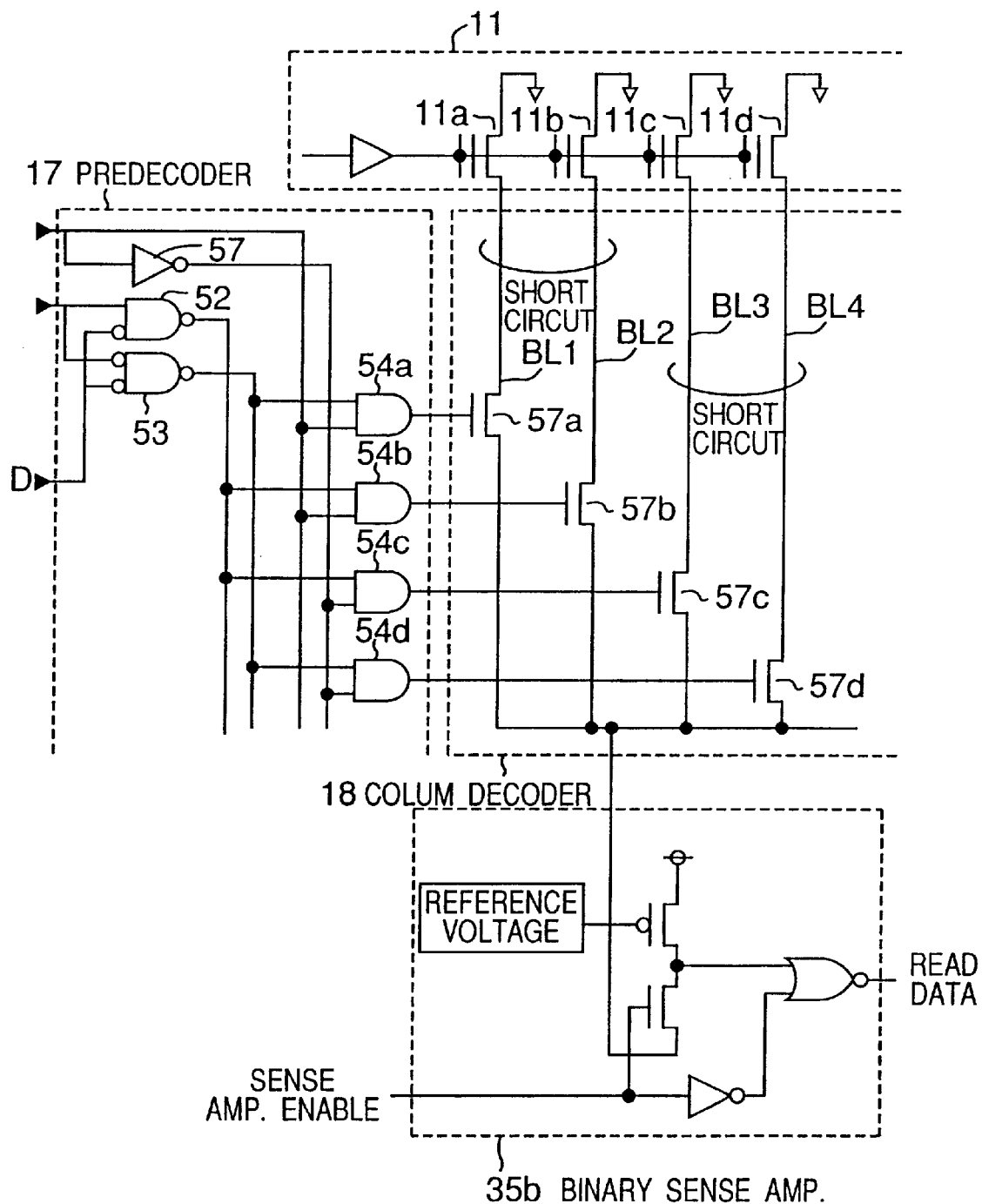
FIG. 3 illustrates a method of reading data from a memory cell connected to a plurality of bit lines.

The binary memory block stores the control program or the like, and is often required to be a memory capable of reading in a high-speed. Therefore, the flash memory of this embodiment may comprise the structure for reading the data from the binary memory block at high speed. FIG. 3 shows the structure for implementing the high-speed reading. In FIG. 3, as an example, one sense amplifier 35b for the binary data is connected to four bit lines. The predecoder 17 comprises logic circuits 51, 52, 53, 54a, 54b, 54c and 54d.

To implement the high-speed reading, in data recording operation, the cells in a same row on two adjacent bit lines form a pair, and one bit data is stored in the pair of cells. In the reading operation of the data, Y gates on two adjacent bit lines are simultaneously turned on, whereby the bit lines are short-circuited to form the pair of bit lines. In short, in the reading operation, by short circuit of a pair of bit lines, the more cell current can be obtained form two cells than from one cell. This enables the reading operation to be carried out in a high speed.

In the example shown in FIG. 3, a signal D can switch a read mode between a high-speed read mode and a normal read mode. To enter the high-speed read mode, the predecoder 17 sets the signal D to "1". Thus, Y gates 57a and 57b or Y gates 57c and 57d simultaneously turned on in response to a signal Y1, so that a set of bit lines BL1 and BL2 or a set of bit lines BL3 and BL4 is short-circuited. Then, one bit data is read out by the cell current from memory cells 11a and 11b or memory cells 11c and 11d. To enter the normal read mode, the signal D is set to "0" and no bit line is short-circuited. Then, one bit line is selected in response to the signals Y1 and Y2, and consequently the data is read from one cell.

(Another Example of Four-valued Sense Amplifier)

Figure 4:
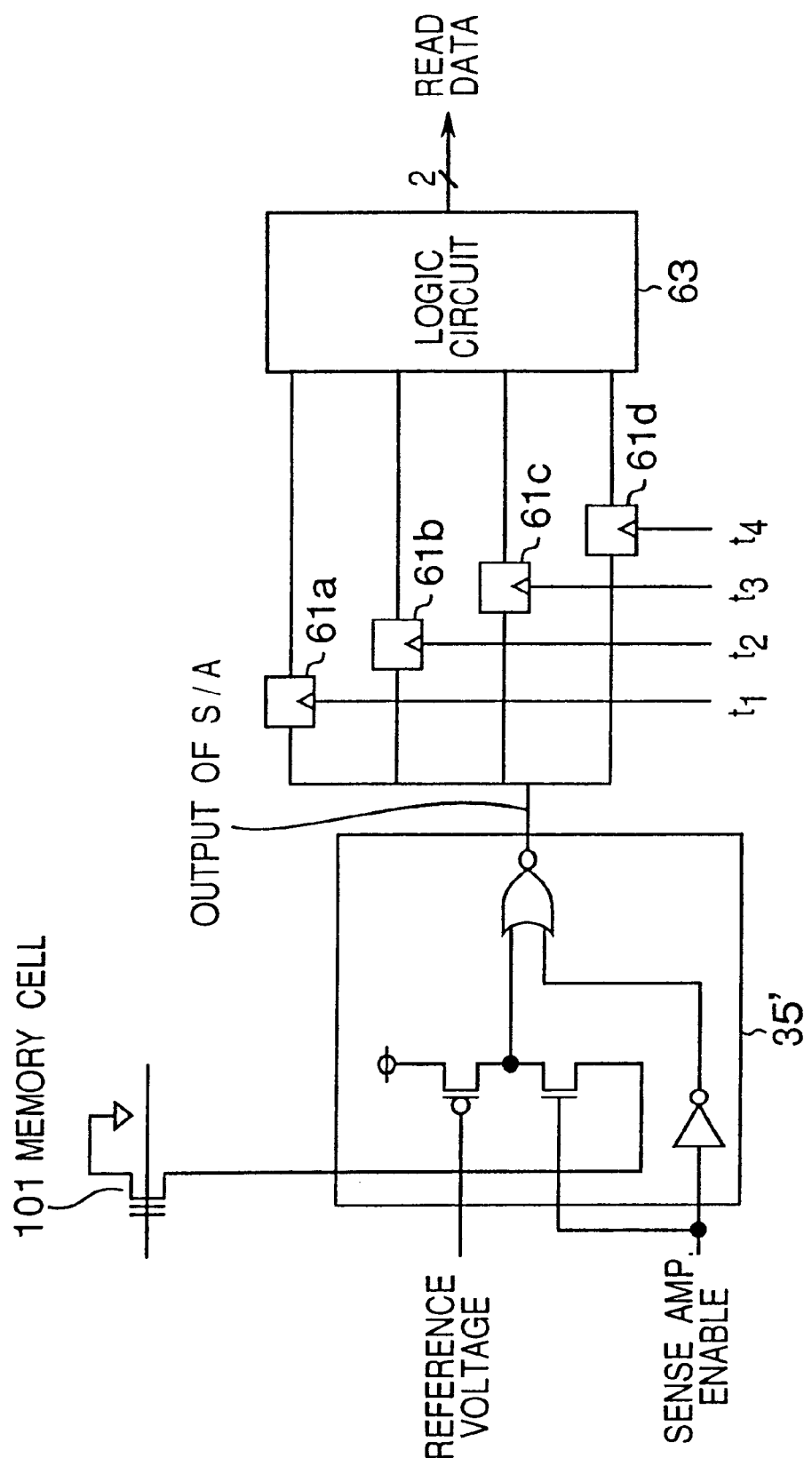
FIG. 4 shows the constitution of a four-valued sense amplifier using an access delay.

FIG. 4 shows the structure of the sense amplifier for the four-valued data having a different structure from the structure of the sense amplifier 35a for the four-valued data. The sense amplifier for the four-valued data shown in FIG. 4 comprises a sense amplifier 35' having the same structure as the one of the sense amplifier 35b for the binary data, latch circuits 61a, 61b, 61c and 61d for latching the output from the sense amplifier 35' at different timings, and a logic circuit 63 for receiving the outputs from the latch circuits 61a, 61b, 61c and 61d to judge the values. The each latch circuits 61a, 61b, 61c or 61d latches the output from the sense amplifier 35' at times t1, t2, t3 or t4, respectively.

When reading the data in one cell with a predetermined word line voltage, another sense amplifier for the four-valued data having the above-described structure reads the four-valued data by using a time lag from when the word line voltage is applied to when the data is outputted from the sense amplifier. The larger the difference between the word line voltage and a threshold voltage of the memory cell is, the smaller the time lag becomes. Therefore, the four-valued data can be read by utilizing the time lag.

Figure 5:
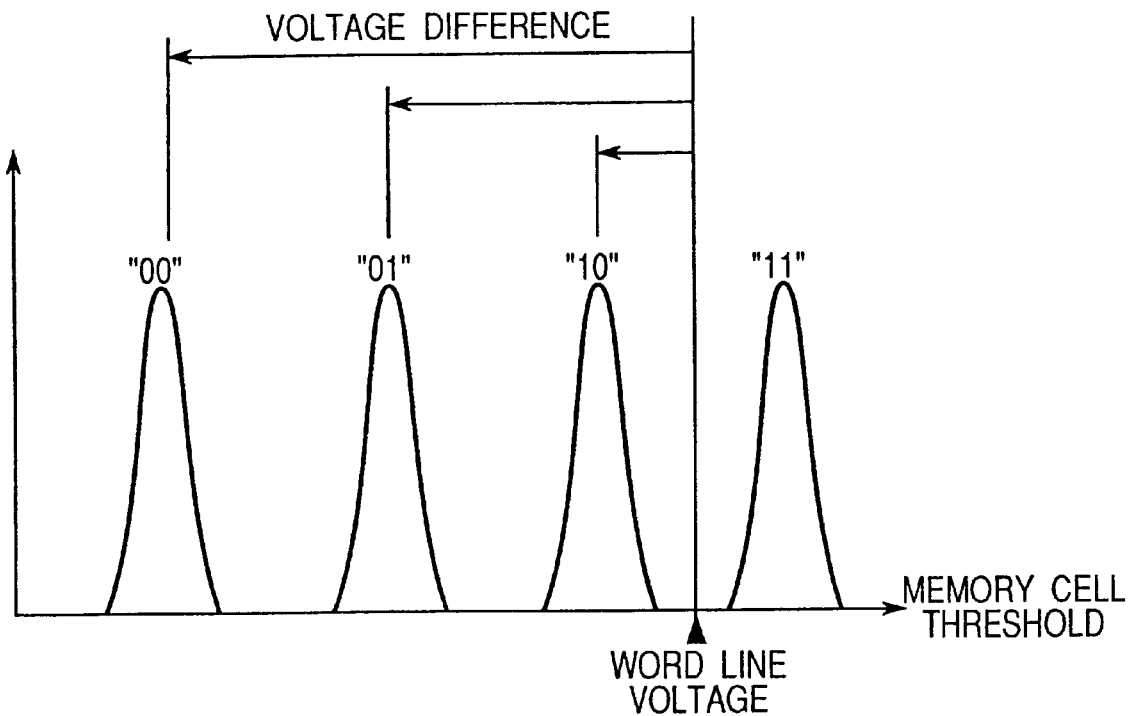
FIG. 5 is a diagram for describing the reading of four-valued data using the access delay.
Figure 6:
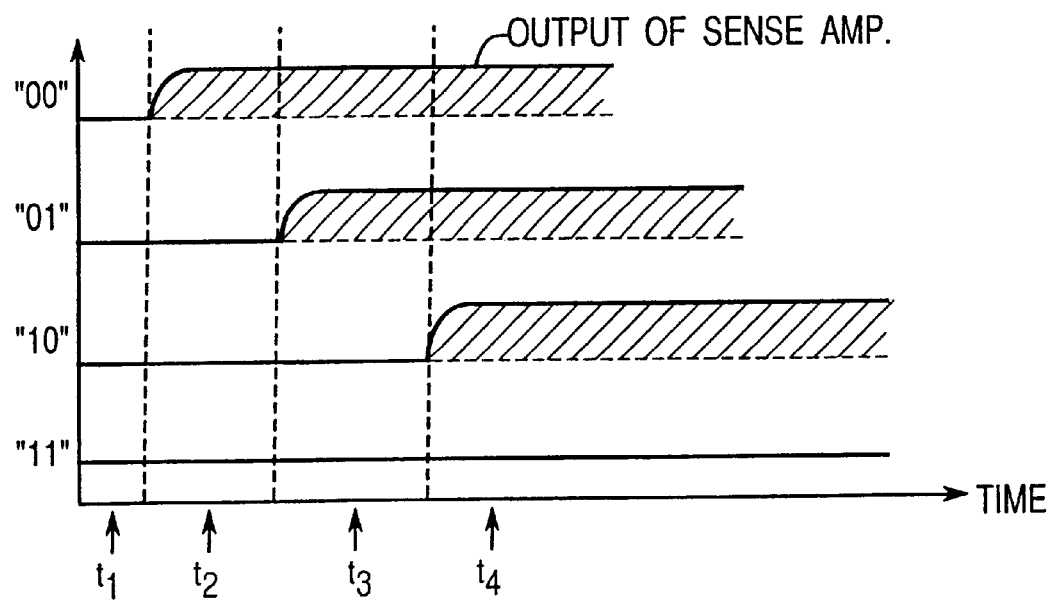
FIG. 6 is a diagram showing a delay time for each value during the reading of the four-valued data.
Figure 7A:
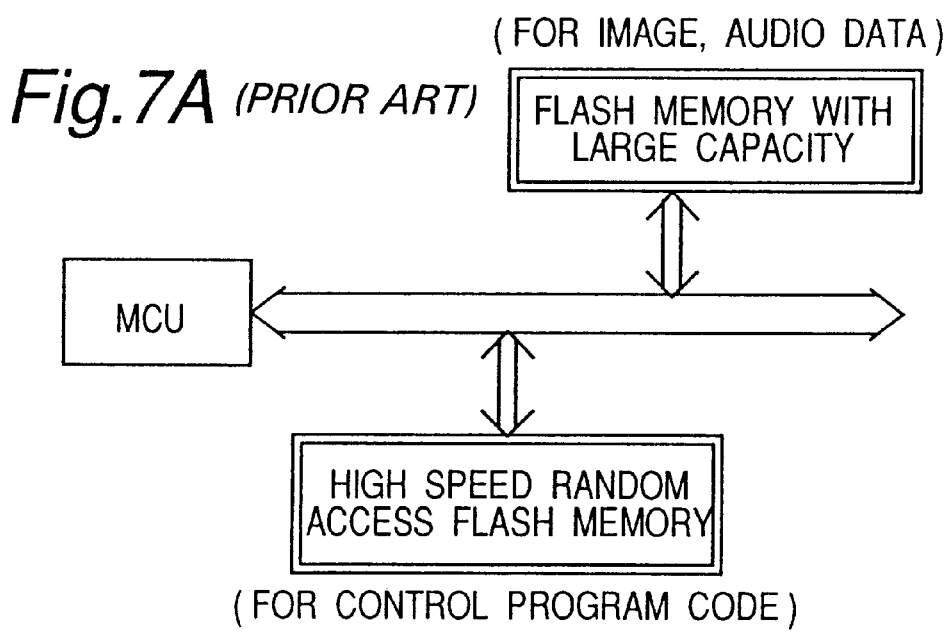
FIGS. 7A to 7C illustrate various forms of use of the flash memory of the prior art.
Figure 7B:
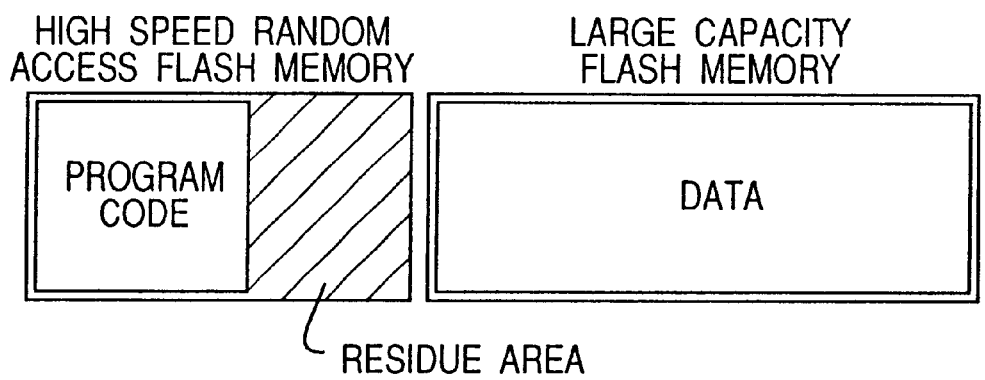
Figure 7C:
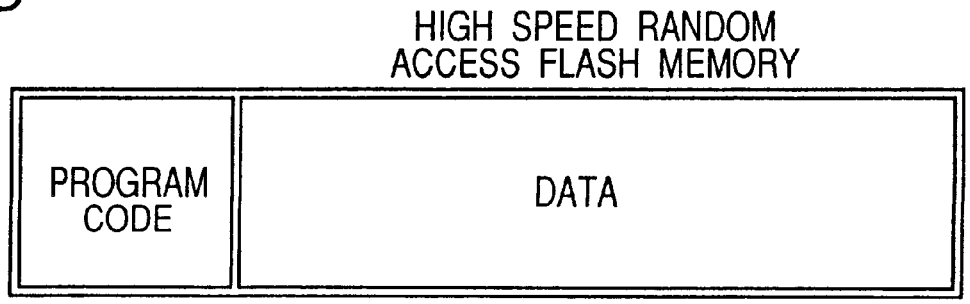

When provided is a distribution of threshold voltage for the four-valued data as shown in FIG. 5, the voltage between values "10" and "11" is applied to the word line as the word line voltage. The read data for a value "00" is outputted from the sense amplifier with the earliest time. The period from when the word line voltage is applied to when the data is outputted increases in the order of the values "01", "10" and "11". Therefore, as shown in FIG. 6, the time t1 is set between the application of the word line voltage and the reading of the value "00". The time t2 is set between the reading of the value "00" and the reading of the value "01". The time t3 is set between the reading of the value "01" and the reading of the value "10". The time t4 is set after the reading of the value "10". The data is read at each time, whereby the four-valued data can be read. That is, the latch circuits 61a, 61b, 61c and 61d latch the output from the sense amplifier "35" at the times t1, t2, t3 and t4, respectively. The logic circuit 63 can recognize the four-valued data by judging the respective outputs from the latch circuits 61a, 61b, 61c and 61d.

As described above, in the flash memory of this embodiment, the memory cell array is divided into a plurality of areas (blocks), and each area can be set to the binary area for recording the binary data or the four-valued area for recording the four-valued data. Thus, the capacity of the flash memory can be variable in accordance with applications, and therefore the memory can be efficiently used.

The recording form of the data is not limited to the binary or four-valued from, and may be larger number-valued (multivalued) form.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. A nonvolatile semiconductor memory device capable of electrical data writing and data reading, comprising:

a memory cell array comprising a plurality of memory cells and having a data storing area divided into a plurality of areas, each of the divided areas selectively being set to a binary area for storing binary data or a multivalued area for storing multivalued data; and a determining unit for storing information which indicates whether the divided area of the memory cell array is set to the binary area or the multivalued area, wherein each divided area of the memory cell array can be set arbitrarily to either of the binary area or the multivalued area in a memory address space.

2. The semiconductor memory device according to claim 1, further comprising a switching unit for switching a method of outputting data to an external device in accordance with whether the data is recorded in the form of binary data or multivalued data.

3. The semiconductor memory device according to claim 1, further comprising a switching unit for switching a method of writing data in accordance with the data is to be recorded in the form of binary data or multivalued data.

4. The semiconductor memory device according to claim 1, further comprising an output unit for outputting latency information corresponding to the address of the data to be read.

5. The semiconductor memory device according to claim 1, further comprising a changing unit for changing a predetermined parameter related to synchronous burst reading in accordance with the address at a synchronous burst reading operation.

6. The semiconductor memory device according to claim 1, further comprising:
- a word line driver for supplying a driving voltage to a word line of the memory cell array;
- a voltage controller for controlling an output voltage of the word line driver;
- a binary/multivalued controller for controlling the voltage controller so as to switch the output voltage of the word line driver in accordance with whether the data is to be recorded to the cell in the form of the binary data or the multivalued data.

7. A nonvolatile semiconductor memory device capable of electrically writing and reading data, comprising:
- a memory cell array comprising a plurality of memory cells and having a data storing area divided into a plurality of areas, each of the divided areas selectively being set to a binary area for storing binary data or a multivalued area for storing multivalued data;
- a binary sense amplifier to be used when the binary data is read out from the memory cell;
- a multivalued sense amplifier to be used when the multivalued data is read out from the memory cell; and
- a binary/multivalued controller for selecting, as a sense amplifier to be used in data reading, the binary sense amplifier when the data is read from the binary area, or the multivalued sense amplifier when the data is read from the multivalued area; and
- a determining unit for storing information which indicates whether the divided area of the memory cell array is set to the binary area or the multivalued area;
- wherein each area of the memory cell array can be set arbitrarily to either of the binary area or the multivalued area in a memory address space.

8. The semiconductor memory device according to claim 7, further comprising a switching unit for switching a method of outputting data to an external device in accordance with whether the data is recorded in the form of binary data or multivalued data.

9. The semiconductor memory device according to claim 7, further comprising a switching unit for switching a method of writing data in accordance with the data is to be recorded in the form of binary data or multivalued data.

10. The semiconductor memory device according to claim 7, further comprising an output unit for outputting latency information corresponding to the address of the data to be read.

11. The semiconductor memory device according to claim 7, further comprising a changing unit for changing a predetermined parameter related to synchronous burst reading in accordance with the address at a synchronous burst reading operation.

12. The semiconductor memory device according to claim 7, wherein the multivalued sense amplifier reads the multivalued data by using a delay during the reading operation of the data from the memory cell.

13. A nonvolatile semiconductor memory device capable of electrically writing and reading data, comprising.
- a memory cell array comprising a plurality of memory cells storing multivalued data;
- a multivalued sense amplifier for determining a value of multivalued data by reading the data with a delay time corresponding to the value of the multivalued data in reading operation of the multivalued data from the memory cells.

14. The semiconductor memory device according to claim 13, wherein the multivalued sense amplifier makes the delay time to read a multivalued data greater as a threshold voltage of the memory cell storing the multivalued data is higher.

15. A nonvolatile semiconductor memory device capable of electrically writing and reading data, comprising:
- a first memory cell connected to a first bit line;
- a second memory cell connected to a second bit line, both of the first and second memory cells storing the same data; and
- a means for short-circuiting the first and second bit lines in reading operation,
- wherein in reading operation, the data is read from the first and second cells with the first and second bit lines being short-circuited together.

16. The semiconductor memory device according to claim 15, wherein the first bit line is adjacent to the second bit line.

* * * * *